(12) United States Patent
Takizawa et al.

(10) Patent No.: US 11,258,441 B2
(45) Date of Patent: Feb. 22, 2022

(54) DRIVE CIRCUIT

(71) Applicant: Rohm Co., Ltd., Kyoto (JP)

(72) Inventors: Shinji Takizawa, Kyoto (JP); Satoru Nate, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/916,839

(22) Filed: Jun. 30, 2020

(65) Prior Publication Data

US 2021/0006244 A1 Jan. 7, 2021

(30) Foreign Application Priority Data

Jul. 3, 2019 (JP) .............................. JP2019-124340

(51) Int. Cl.
*H03K 17/16* (2006.01)
*H02M 1/08* (2006.01)
*H02M 3/335* (2006.01)
*H02M 3/156* (2006.01)
*H02M 1/00* (2006.01)

(52) U.S. Cl.
CPC ............ *H03K 17/162* (2013.01); *H02M 1/08* (2013.01); *H02M 3/156* (2013.01); *H02M 3/33523* (2013.01); *H03K 17/165* (2013.01); *H02M 1/0054* (2021.05)

(58) Field of Classification Search
CPC ...... H02M 1/08; H02M 3/156; H03K 17/162; H03K 17/167; H03K 17/165–166; H03K 17/122; H03K 17/102
See application file for complete search history.

(56) References Cited

U.S. PATENT DOCUMENTS

| | | | | |
|---|---|---|---|---|
| 3,712,995 A | * | 1/1973 | Steudel | H01L 27/0255 361/110 |
| 2012/0286752 A1 | * | 11/2012 | Tsukiji | H04N 5/63 323/282 |
| 2014/0300398 A1 | * | 10/2014 | Drake | H03K 5/133 327/278 |
| 2015/0061615 A1 | * | 3/2015 | Michishita | H02M 3/1588 323/271 |

FOREIGN PATENT DOCUMENTS

JP 2014-233043 12/2014

* cited by examiner

*Primary Examiner* — Patrick C Chen
(74) *Attorney, Agent, or Firm* — Fish & Richardson P.C.

(57) ABSTRACT

A drive circuit includes: a current capability switch configured to switch a current capability of driving an output transistor of a switching power supply according to whether a switch current flowing through the output transistor is in a continuous mode or in a discontinuous mode.

8 Claims, 8 Drawing Sheets

DRIVE CIRCUIT

CROSS-REFERENCE TO RELATED APPLICATION

This application is based upon and claims the benefit of priority from Japanese Patent Application No. 2019-124340, filed on Jul. 3, 2019, the entire contents of which are incorporated herein by reference.

TECHNICAL FIELD

The present disclosure relates to a drive circuit for use in switching power supplies.

BACKGROUND

In the related art, a switching power supply (a so-called DC/DC converter) that generates a desired output voltage from an input voltage has been used as a power supply means for various applications.

However, in the related art, there has been room for further study on eliminating a trade-off between noise characteristics and efficiency in the switching power supply.

SUMMARY

Some embodiments of the present disclosure provide a drive circuit capable of eliminating the trade-off between noise characteristics and efficiency in a switching power supply.

According to one embodiment of the present disclosure, there is provided a drive circuit including: a current capability switch configured to switch a current capability of driving an output transistor of a switching power supply according to whether a switch current flowing through the output transistor is in a continuous mode or in a discontinuous mode.

In some embodiments, the current capability switch may be further configured to lower the current capability when the switch current is in the continuous mode, and raise the current capability when the switch current is in the discontinuous mode.

In some embodiments, the drive circuit may further includes: a first transistor connected between a first power supply terminal and a control terminal of the output transistor; and a second transistor connected between a second power supply terminal and the control terminal of the output transistor, wherein the output transistor is driven by complementarily turning on/off the first transistor and the second transistor.

In some embodiments, the current capability switch may include a third transistor connected in parallel to the first transistor or the second transistor, and be configured to turn off the third transistor when the switch current is in the continuous mode, and turn on or off the third transistor in synchronization with the first transistor or the second transistor when the switch current is in the discontinuous mode.

In some embodiments, the current capability switch may include a third transistor connected in series with the first transistor or the second transistor, and be further configured to set the third transistor in a half-on state when the switch current is in the continuous mode, and set the third transistor in a full-on state when the switch current is in the discontinuous mode.

In some embodiments, the current capability switch may include a clamper configured to limit a voltage applied to the first transistor or the second transistor, and be further configured to lower the current capability of the clamper when the switch current is in the continuous mode, and raise the current capability of the clamper when the switch current is in the discontinuous mode.

In some embodiments, the current capability switch may include a current limiting element connected in series with the first transistor or the second transistor, and a third transistor connected in parallel with the current limiting element, and be further configured to turn off the third transistor when the switch current is in the continuous mode, and turn on the third transistor when the switch current is in the discontinuous mode.

In another embodiment of the present disclosure, there is provided a switching power supply including: a switch output circuit configured to use an output transistor to generate an output voltage from an input voltage; the drive circuit described above, which is configured to drive the output transistor; and a mode detection circuit configured to detect whether the switch current flowing through the output transistor is in the continuous mode or in the discontinuous mode.

In some embodiments, the mode detection circuit may be further configured to detect an edge of the switch current at a timing when the output transistor is turned on.

In some embodiments, the mode detection circuit may be further configured to determine that the switch current is in the continuous mode when the edge of the switch current is detected once or a plurality of times in succession, and determine that the switch current is in the discontinuous mode when the edge of the switch current is not detected for a predetermined time.

DETAILED DESCRIPTION

<Switching Power Supply (Non-Insulated Type)>

Figure 1:
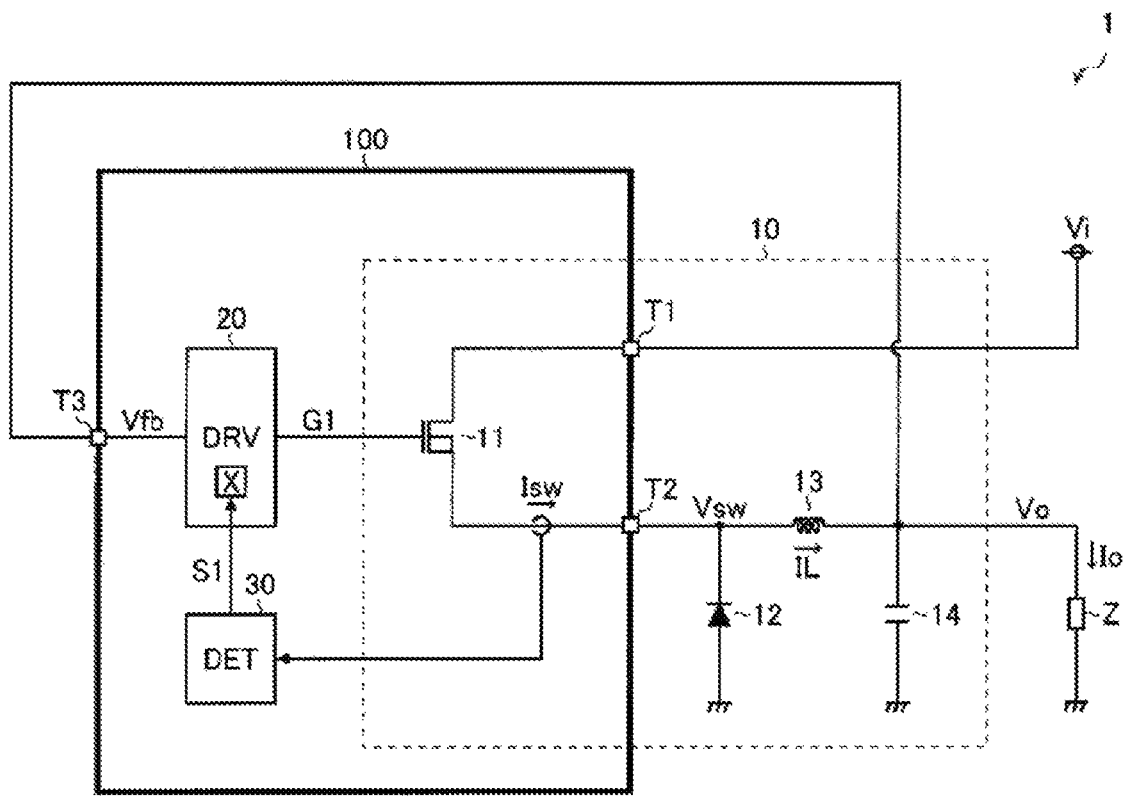
FIG. 1 is a view showing an overall configuration of a switching power supply (non-insulated type).

FIG. 1 is a view showing an overall configuration of a switching power supply (non-insulated type). A switching power supply 1 of this configuration example is a non-insulated type step-down DC/DC converter (a so-called buck converter) that generates a desired output voltage Vo from an input voltage Vi and supplies the same to a load Z. The switching power supply 1 includes a switch output circuit 10, a gate drive circuit 20, and a mode detection circuit 30.

The above-mentioned constituent elements may be integrated in a semiconductor device 100 (a so-called power supply control IC) that is the control entity of the switching power supply 1 except for some constituent elements (a diode 12, an inductor 13, and a capacitor 14 in this figure) included in the switch output circuit 10. In addition to the above-mentioned constituent elements, the semiconductor device 100 may include any constituent elements (such as various protection circuits) as appropriate.

In addition, the semiconductor device 100 has a plurality of external terminals (three terminals, i.e., a power supply terminal T1, an output terminal T2, and a feedback terminal T3, are illustrated in the figure) as an example of means for establishing electrical connection with the outside of the device.

The switch output circuit 10 is a step-down type output stage that drives an inductor current IL to generate the desired output voltage Vo from the input voltage Vi by turning on/off an output transistor 11. The switch output circuit 10 includes the output transistor 11 (for example, an N-channel type super junction metal oxide semiconductor field effect transistor [SJMOSFET]), the diode 12, the inductor 13, and the capacitor 14.

The drain of the output transistor 11 is connected to the power supply terminal T1 (corresponding to the application terminal of the input voltage Vi). A source and a back gate of the output transistor 11 are connected to the output terminal T2 (corresponding to the application terminal of a switch voltage Vsw). A gate of the output transistor 11 is connected to the application terminal of a gate signal G1. The output transistor 11 is turned on when the gate signal G1 is at a high level, and is turned off when the gate signal G1 is at a low level. If the output transistor 11 has a super junction structure, it is possible to reduce an on-resistance and a gate charge amount while maintaining a breakdown voltage. However, when the output transistor 11 is of an N-channel type, a boosting means (a bootstrap circuit or a charge pump circuit) configured to raise the high level of the gate signal G1 to a voltage value higher than the input voltage Vi is required.

A cathode of the diode 12 and a first end of the inductor 13 are both connected to the output terminal T2. A second end of the inductor 13 and a first end of the capacitor 14 are both connected to the application terminal of the output voltage Vo (corresponding to a high potential end of the load Z). An anode of the diode 12, a second end of the capacitor 14, and a low potential end of the load Z are all connected to a ground terminal.

As the output transistor 11 is turned on/off, a rectangular wave switch voltage Vsw pulse-driven between the input voltage Vi and the ground voltage GND is generated at the output terminal T2. Therefore, the output voltage Vo can be obtained by rectifying and smoothing the switch voltage Vsw.

The output format of the switch output circuit 10 is not limited to the above-described step-down type, and may be a step-up type, a step-down/step-up type, or an inverting type. In addition, a rectification method of the switch output circuit 10 is not limited to the diode rectification method, and may adopt a synchronous rectification method.

In addition, the output transistor 11 can be externally attached to the semiconductor device 100. In that case, an output terminal for the gate signal G1 is required.

The gate drive circuit 20 controls a duty of the gate signal G1 so that a feedback voltage Vfb (corresponding to the output voltage Vo or its divided voltage) input to the feedback terminal T3 matches a predetermined reference voltage Vref (not shown). An output feedback control method may adopt a voltage mode control method or a current mode control method, or may adopt a hysteresis control method (an on-time fixed bottom detection control method, an off-time fixed peak detection control method, or a window comparator control method).

By the way, noise characteristics and efficiency of the switching power supply 1 are generally in a trade-off relationship. That is, if a drive speed of the output transistor 11 is increased, a switching loss can be reduced and the efficiency can be improved, but the switching noise increases so that the noise characteristics deteriorate. Conversely, if the drive speed of the output transistor 11 is decreased, overshoot and ringing can be suppressed to improve noise characteristics, but the switching loss is increased so that the efficiency deteriorates.

Therefore, the gate drive circuit 20 includes a current capability switching part (or a current capability switch) X that switches the current capability to drive the output transistor 11 depending on whether a switch current Isw flowing through the output transistor 11 of the switching power supply 1 is in a continuous mode (S1=H) or a discontinuous mode (S1=L). For example, when the switch current Isw is in the continuous mode (S1=H), the current capability switching part X lowers the current capability by increasing the on-resistance value of the transistor forming the output stage of the gate drive circuit 20. When the switch current Isw is in the discontinuous mode (S1=L), the current capability switching part X raises the current capability by decreasing the on-resistance value of the transistor. A circuit configuration and an operation of the gate drive circuit 20 (and the current capability switching part X) will be described later in detail by taking various embodiments as examples.

The mode detection circuit 30 detects whether the switch current Isw flowing through the output transistor 11 is in the continuous mode or the discontinuous mode, and outputs a result of the detection as a mode detection signal S1. For example, the mode detection signal S1 has a high level (H) when the continuous mode is detected, and has a low level (L) when the discontinuous mode is detected.

The continuous mode refers to an operation mode in which the inductor current IL continues to flow continuously without interruption during an off period of the output transistor 11 when the output current Io flowing through the load Z is relatively large (a so-called heavy load state). On the other hand, the discontinuous mode refers to an operation mode in which the inductor current IL is interrupted and does not flow during the off period of the output transistor 11 when the output current Io flowing through the load Z is relatively small (a so-called light load state).

Gate Drive Device (First Embodiment)

Figure 2:
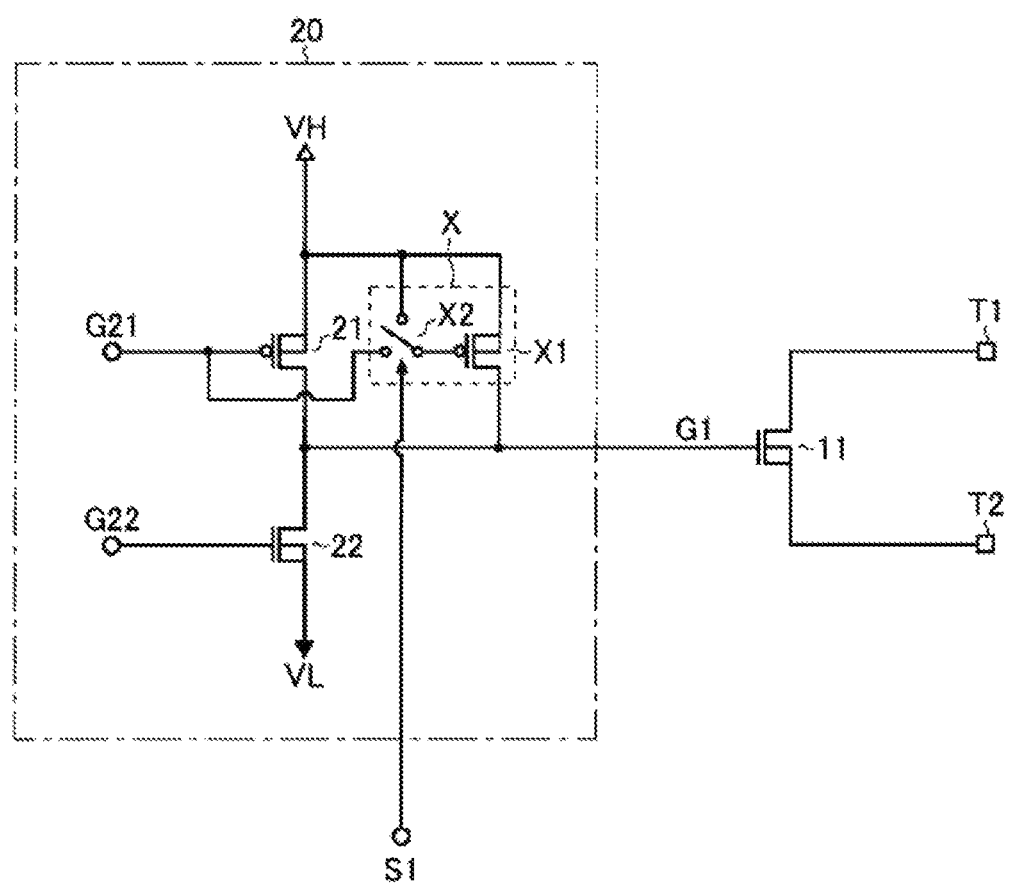
FIG. 2 is a view showing a gate drive circuit according to a first embodiment of the present disclosure.

FIG. 2 is a view showing a gate drive circuit 20 according to a first embodiment of the present disclosure. The gate drive circuit 20 of the first embodiment includes a PMOSFET 21, an NMOSFET 22, and a current capability switching part X (a PMOSFET X1 and a selector X2).

Sources and Back gates of the PMOSFETs 21 and X1 are both connected to a first power supply terminal VH (for example, VH=Vi+α). Drains of the PMOSFETs 21 and X1 and a drain of the NMOSFET 22 are all connected to the gate of the output transistor 11. A source and a back gate of the NMOSFET 22 are both connected to a second power supply terminal VL (for example, VL=Vsw).

The PMOSFET 21 corresponds to a first transistor connected between the first power supply terminal VH and the gate of the output transistor 11. The NMOSFET 22 corresponds to a second transistor connected between the second power supply terminal VL and the gate of the output transistor 11. The PMOSFET X1 corresponds to a third transistor connected in parallel with the PMOSFET 21.

Gate signals G21 and G22 are input to the gates of the PMOSFET 21 and NMOSFET 22, respectively. Therefore, when G21=G22=L, the PMOSFET 21 is turned on and the NMOSFET 22 is turned off. As a result, G1=VH, so that the output transistor 11 is turned on. On the other hand, when G21=G22=H, the PMOSFET 21 is turned off and the NMOSFET 22 is turned on. As a result, G1=VL, so that the output transistor 11 is turned off.

In this way, the gate drive circuit 20 drives the gate signal G1 of the output transistor 11 by turning on/off the PMOSFET 21 and the NMOSFET 22 complementarily as its basic operation.

Further, the selector X2 switches a gate connection destination of the PMOSFET X1 according to the mode detection signal S1. Specifically, when the switch current Isw is in the continuous mode (S1=H), a gate of the PMOSFET X1 is connected to the source of the PMOSFET X1, so that the PMOSFET X1 is switched to the off state.

As a result, the current capability to turn on the output transistor 11 (corresponding to the capability to supply a source current to raise the gate signal G1 of the output transistor 11 to a high level) is only the current capability of the PMOSFET 21. This state may also be understood as a state in which an on-resistance value of an upper transistor (corresponding to a transistor that connects/disconnects a path through which the source current flows) forming a half-bridge output stage of the gate drive circuit 20 is increased.

In this way, when the switch current Isw is in the continuous mode (at the time of heavy load), considering that the efficiency is not significantly affected even if the switching loss increases to some extent, priority is given to the improvement of noise characteristics by decreasing the drive speed of the output transistor 11. Further, since a general noise test is performed in a heavy load state (continuous mode), it is also effective as a countermeasure thereto.

On the other hand, when the switch current Isw is in the discontinuous mode (S1=L), the gate of the PMOSFET X1 is connected to the gate of the PMOSFET 21, so that the PMOSFET X1 is switched on/off in synchronization with the PMOSFET 21. As a result, the current capability to turn on the output transistor 11 is an additive current capability of both PMOSFETs 21 and X1. This state can also be understood as a state in which the on-resistance value of the upper transistor forming the half-bridge output stage of the gate drive circuit 20 is decreased.

In this way, when the switch current Isw is in the discontinuous mode (at the time of light load), considering that the increase in the switching loss has a great influence on the efficiency, priority is given to the improvement of efficiency by raising the drive speed of the output transistor 11.

Gate Drive Device (Second Embodiment)

Figure 3:
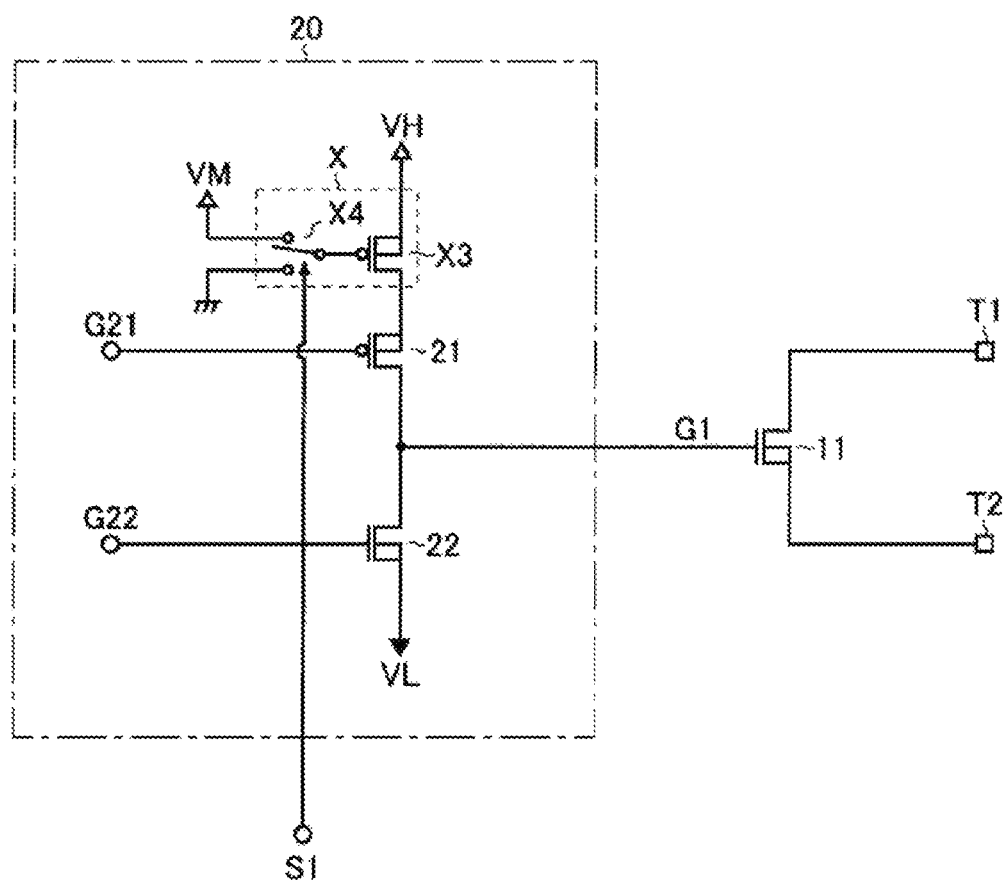
FIG. 3 is a view showing a gate drive circuit according to a second embodiment of the present disclosure.

FIG. 3 is a view showing a gate drive circuit 20 according to a second embodiment of the present disclosure. In the present embodiment, a PMOSFET X3 and a selector X4 are provided as constituent elements of the current capability switching part X. The source and back gate of the PMOSFET X3 are connected to the first power supply terminal VH. The drain of the PMOSFET X3 is connected to the source and back gate of the PMOSFET 21. The PMOSFET X3 corresponds to a third transistor connected in series with the PMOSFET 21.

The selector X4 switches a gate connection destination of the PMOSFET X3 according to the mode detection signal S1. Specifically, when the switch current Isw is in the continuous mode (S1=H), the gate of the PMOSFET X3 is connected to a third power supply terminal VM (provided that GND<VM<VH), so that the PMOSFET X3 is switched to a half-on state (corresponding to a state in which only a source current smaller than that in a full-on state can flow). This state is equivalent to a state in which the current capability is reduced by increasing the on-resistance value of the upper transistor. Therefore, the drive speed of the output transistor 11 is decreased, and priority is given to the improvement of noise characteristics.

On the other hand, when the switch current Isw is in the discontinuous mode (S1=L), the gate of the PMOSFET X3 is connected to the ground terminal (GND), so that the PMOSFET X3 is switched to the full-on state (corresponding to a state in which a maximum source current can flow). This state is equivalent to a state in which the current capability is increased by decreasing the on-resistance value of the upper transistor. Therefore, the drive speed of the output transistor 11 is increased, and priority is given to the improvement of efficiency.

Gate Drive Device (Third Embodiment)

Figure 4:
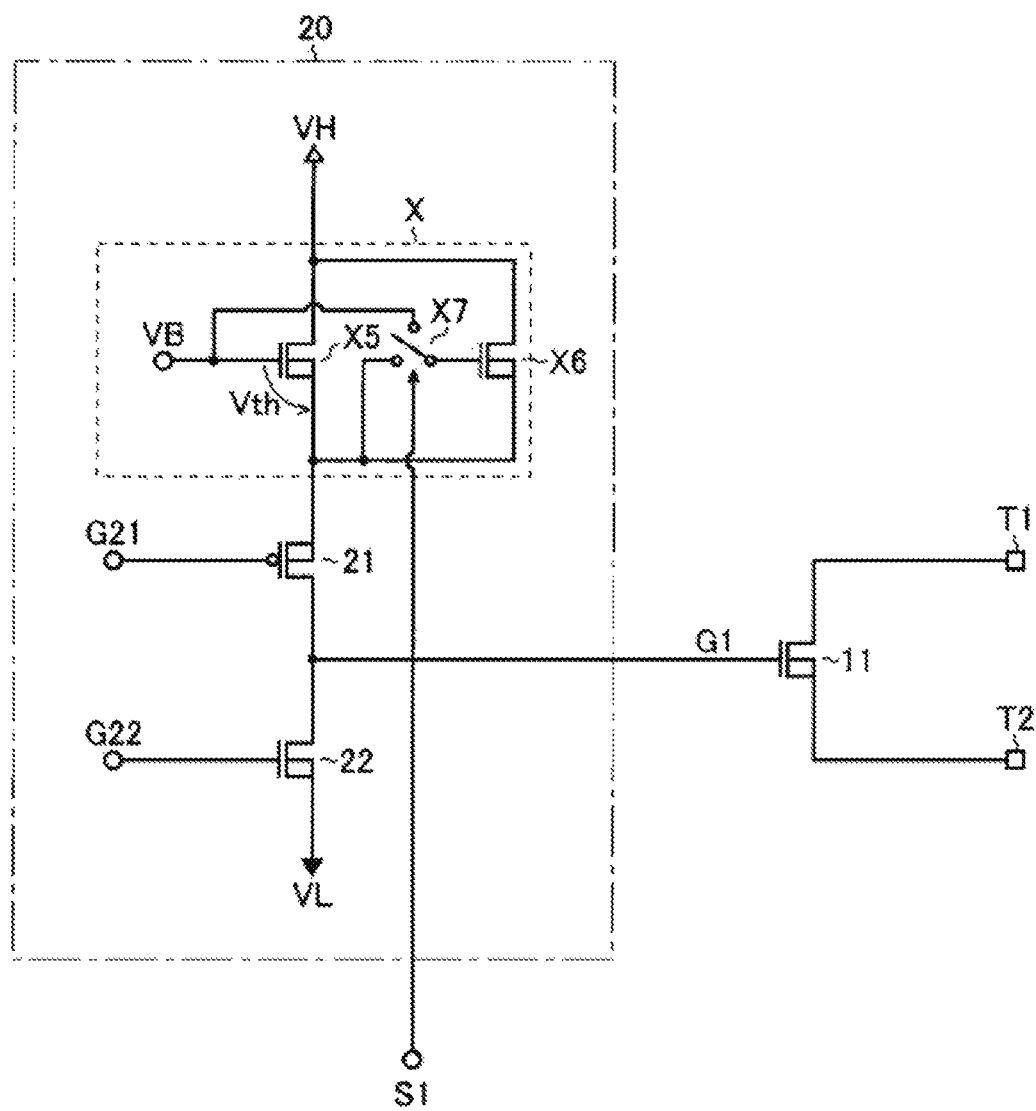
FIG. 4 is a view showing a gate drive circuit according to a third embodiment of the present disclosure.

FIG. 4 is a view showing a gate drive circuit 20 according to a third embodiment of the present disclosure. In the third embodiment, NMOSFETs X5 and X6 and a selector X7 are provided as constituent elements of the current capability switching part X. The drains of the NMOSFETs X5 and X6 are both connected to the first power supply terminal VH. The sources and back gates of the NMOSFETs X5 and X6 are both connected to the source and back gate of the PMOSFET 21.

A predetermined bias voltage VB is applied to the gate of the NMOSFET X5. Therefore, the NMOSFET X5 functions as a gate clamper that limits a source voltage of the PMOSFET 21 (further the high level voltage of the gate signal G1) to a predetermined upper limit value (corresponding to VB−Vth, where Vth is the on-threshold voltage of the NMOSFET X5) or lower.

Further, the selector X7 switches a gate connection destination of the NMOSFET X6 according to the mode detection signal S1. Specifically, when the switch current Isw is in the continuous mode (S1=H), the gate of the NMOSFET X6 is connected to the source of the NMOSFET X6, so that the NMOSFET X6 is switched to the off state. As a result, the current capability of the gate clamper is only the current capability of the NMOSFET X5. This state is equivalent to a state in which the current capability is decreased by increasing the on-resistance value of the upper transistor. Therefore, the drive speed of the output transistor 11 is decreased, and priority is given to the improvement of noise characteristics.

On the other hand, when the switch current Isw is in the discontinuous mode (S1=L), the gate of the NMOSFET X6 is connected to the gate of the NMOSFET X5, so that the NMOSFET X6 functions as a gate clamper together with the NMOSFET X5. As a result, the current capability of the gate clamper becomes an additive current capability of both NMOSFETs X5 and X6. This state is equivalent to a state in which the current capability is increased by decreasing the on-resistance value of the upper transistor. Therefore, the drive speed of the output transistor 11 is increased, and priority is given to the improvement of the efficiency.

Gate Drive Device (Fourth Embodiment)

Figure 5:
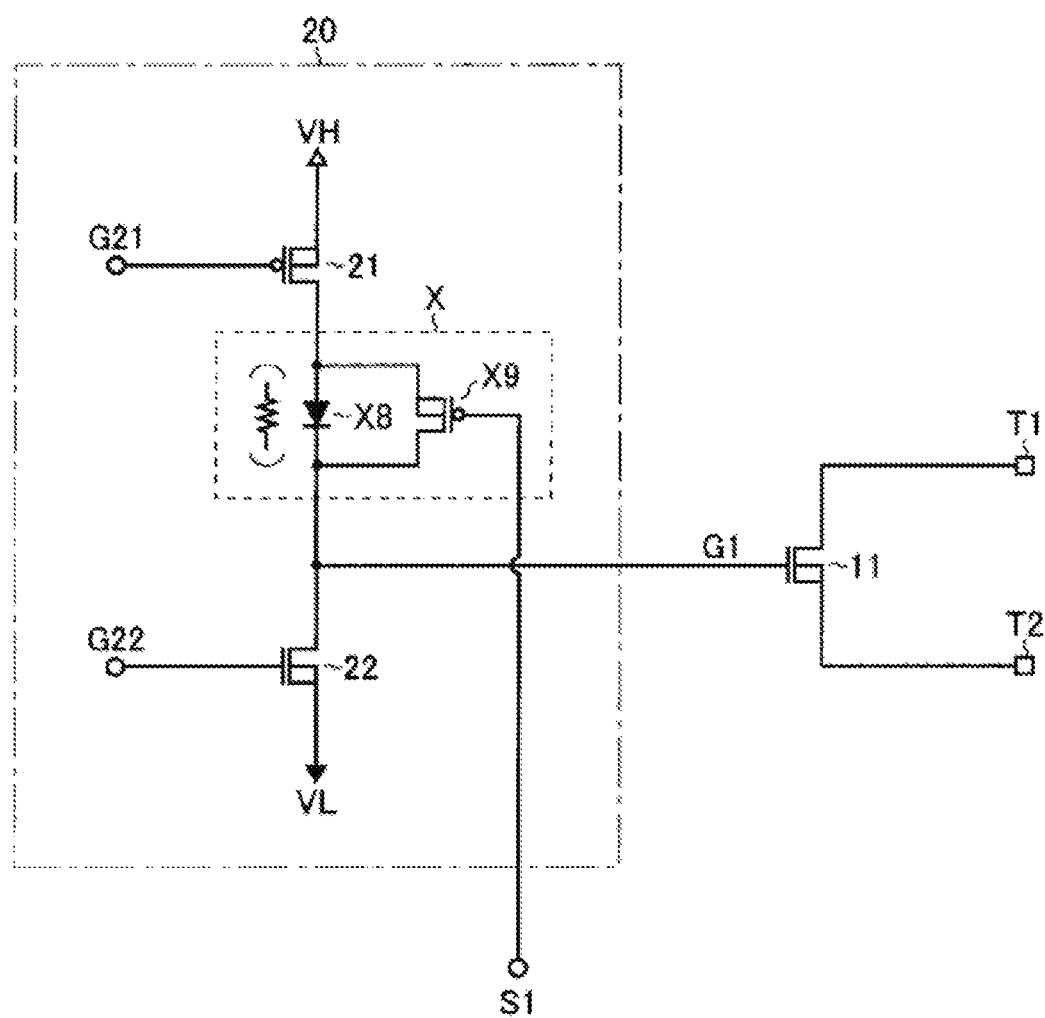
FIG. 5 is a view showing a gate drive circuit according to a fourth embodiment of the present disclosure.

FIG. 5 is a view showing a gate drive circuit 20 according to a fourth embodiment of the present disclosure. In the present embodiment, a diode X8 and a PMOSFET X9 are provided as constituent elements of the current capability switching part X. An anode of the diode X8 and a source and a back gate of the PMOSFET X9 are all connected to the drain of the PMOSFET 21. A cathode of the diode X8 and a drain of the PMOSFET X9 are both connected to the gate of the output transistor 11.

The diode X8 corresponds to a current limiting element connected in series with the PMOSFET 21. As the current limiting element, a resistor may be used instead of the diode X8. The PMOSFET X9 corresponds to a third transistor connected in parallel with the current limiting element.

The mode detection signal S1 is input to a gate of the PMOSFET X9. Therefore, when the switch current Isw is in the continuous mode (S1=H), the PMOSFET X9 is turned off, so that the current limiting element is inserted in the half-bridge output stage of the gate drive circuit 20. This state is equivalent to a state in which the current capability is decreased by increasing the on-resistance value of the upper transistor. Therefore, the drive speed of the output transistor 11 is decreased, and priority is given to the improvement of noise characteristics.

On the other hand, when the switch current Isw is in the discontinuous mode (S1=L), the PMOSFET X9 is turned on, so that the current limiting element is bypassed. This state is equivalent to a state in which the current capability is increased by decreasing the on-resistance value of the upper transistor. Therefore, the drive speed of the output transistor 11 is increased, and priority is given to the improvement of efficiency.

Gate Drive Device (Fifth Embodiment)

Figure 6:
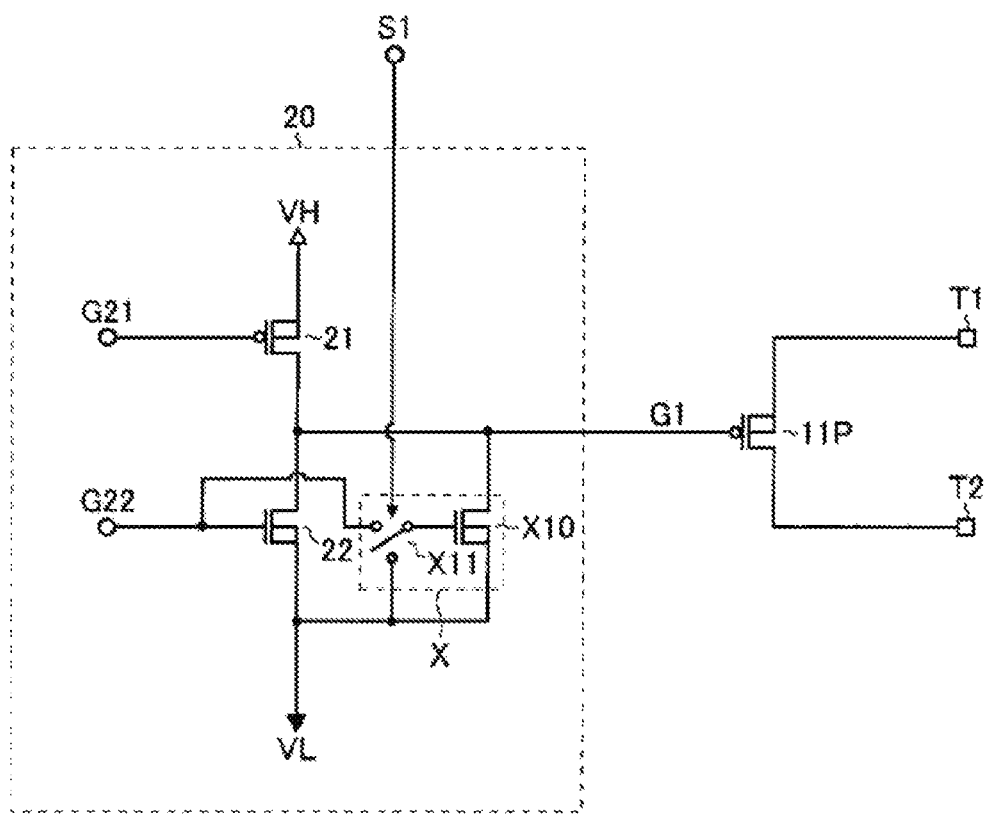
FIG. 6 is a view showing a gate drive circuit according to a fifth embodiment of the present disclosure.

FIG. 6 is a view showing a gate drive circuit 20 according to a fifth embodiment of the present disclosure. In the present embodiment, a P-channel type output transistor 11P is used. With this change, an NMOSFET X10 and a selector X11 are provided as constituent elements of the current capability switching part X.

A source and a back gate of the NMOSFET X10 are both connected to the second power supply terminal VL. A drain of the NMOSFET X10 is connected to a gate of the output transistor 11P. The NMOSFET X10 corresponds to a third transistor connected in parallel with the NMOSFET 22.

The selector X11 switches a gate connection destination of the NMOSFET X10 according to the mode detection signal S1. Specifically, when the switch current Isw is in the continuous mode (S1=H), a gate of the NMOSFET X10 is connected to the source of the NMOSFET X10, so that the NMOSFET X10 is switched to the off state.

As a result, the current capability to turn on the output transistor 11P (corresponding to the capability to draw a sink current in order to lower a gate signal G1 of the output transistor 11P to a low level) is only the current capability of the NMOSFET 22. This state can also be understood as a state in which the on-resistance value of the lower transistor (corresponding to a transistor that connects/disconnects a path through which the sink current flows) forming the half-bridge output stage of the gate drive circuit 20 is increased.

In this way, when the switch current Isw is in the continuous mode (at the time of heavy load), priority is given to the improvement of noise characteristics by decreasing the drive speed of the output transistor 11P.

On the other hand, when the switch current Isw is in the discontinuous mode (S1=L), the gate of the NMOSFET X10 is connected to the gate of the NMOSFET 22, so that the NMOSFET X10 is switched on/off in synchronization with the NMOSFET 22. As a result, the current capability to turn on the output transistor 11P is the additive current capability of both NMOSFETs 22 and X10. This state can also be understood as a state in which the on-resistance value of the lower transistor forming the half-bridge output stage of the gate drive circuit 20 is decreased.

In this way, when the switch current Isw is in the continuous mode (at the time of light load), priority is given to the improvement of efficiency by increasing the drive speed of the output transistor 11P.

Although the present embodiment is described based on an example in which the polarity of the current capability switching part X is changed based on the first embodiment (FIG. 2), it is also possible to deal with the P-channel type output transistor 11P by changing the polarity of the current capability switching part X based on the second embodiment (FIG. 3), the third embodiment (FIG. 4), and the fourth embodiment (FIG. 5).

<Mode Detection Operation>

Figure 7:
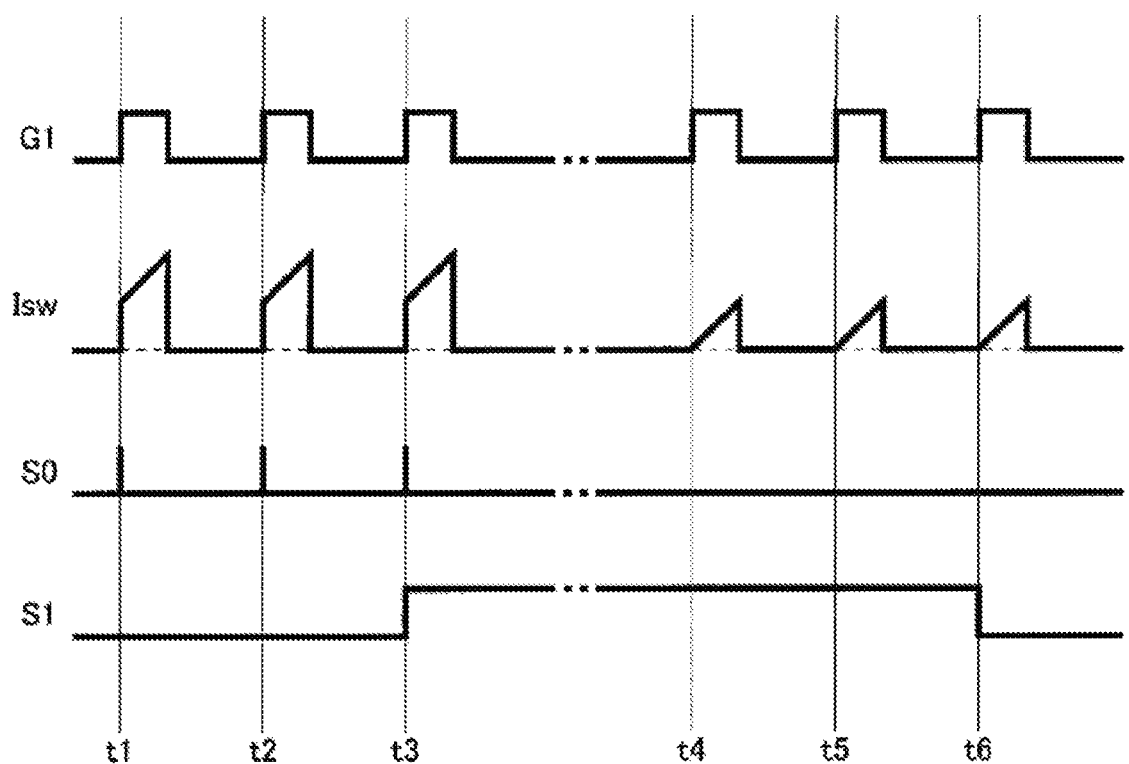
FIG. 7 is a view showing an example of mode detection operation.

FIG. 7 is a view showing an example of a mode detection operation in the mode detection circuit 30, in which the gate signal G1, the switch current Isw, an edge detection signal S0 (corresponding to an internal signal of the mode detection circuit 30), and the mode detection signal S1 are depicted in order from the top.

As shown in this figure, the mode detection circuit 30 detects an edge of the switch current Isw at a timing when the output transistor 11 is turned on. First, a case where the switch current Isw is in the continuous mode will be described with reference to times t1 to t3. In this case, at a timing when the gate signal G1 rises to a high level and the output transistor 11 is turned on, the switch current Isw sharply increases to the bottom value (>0A) of the inductor current IL. The mode detection circuit 30 detects such a rising edge of the switch current Isw and generates a pulse in the edge detection signal S0. When the rising edge of the switch current Isw is detected once or a plurality of times in succession, the mode detection circuit 30 determines that the switch current Isw is in the continuous mode, and raises the mode detection signal S1 to the high level.

Next, a case where the switch current Isw is in the discontinuous mode will be described with reference to times t4 to t6. In this case, at the timing when the gate signal G1 rises to the high level and the output transistor 11 is turned on, the inductor current IL is not flowing, so that the switch current Isw starts increasing from 0A. Therefore, the rising edge of the switch current Isw is not detected, and no pulse is generated in the edge detection signal S0. Then, if the rising edge of the switch current Isw is not detected for a predetermined time, the mode detection circuit 30 determines that the switch current Isw is in the discontinuous mode, and lowers the mode detection signal S1 to a low level.

<Switching Power Supply (Insulated Type)>

Figure 8:
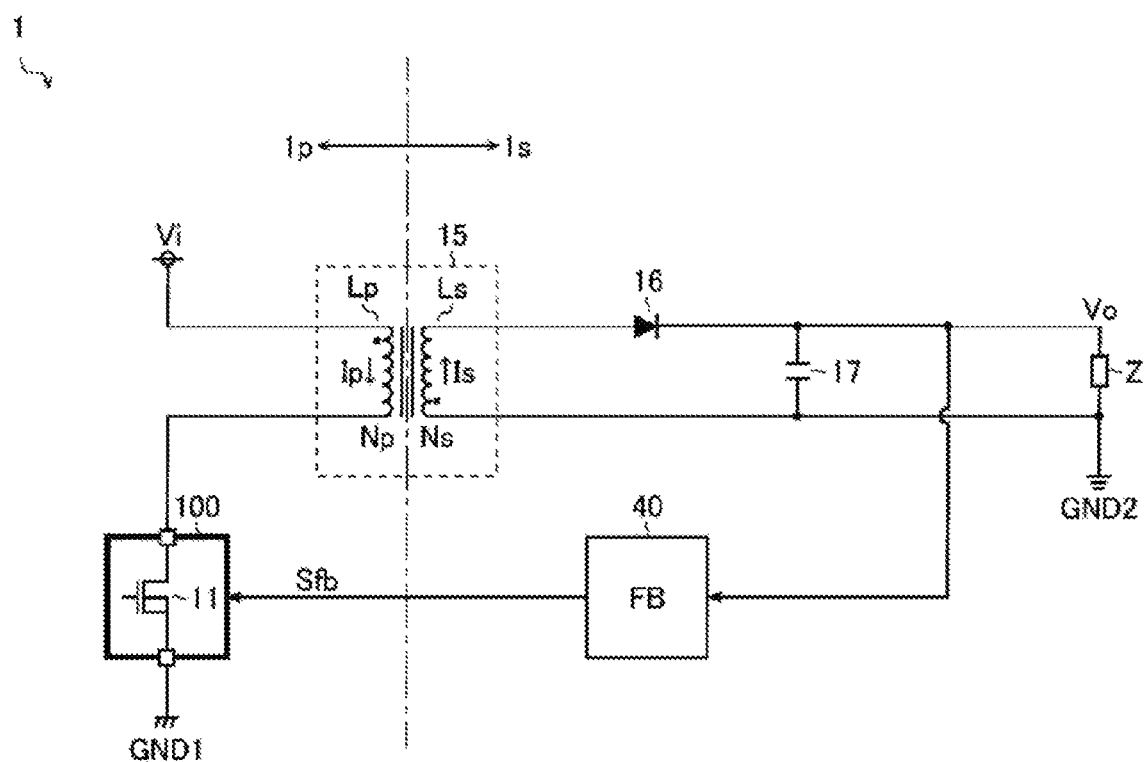
FIG. 8 is a view showing an overall configuration of a switching power supply (insulated type).

FIG. 8 is a view showing an overall configuration of a switching power supply (insulated type). A switching power supply 1 of this configuration example is an insulated type DC/DC converter (a so-called fly-back converter) that generates a desired output voltage Vo from an input voltage Vi while establishing an electrical insulation between a primary circuit system 1p (GND1 system) and a secondary circuit system is (GND2 system), and supplies the output voltage Vo to a load Z. The switching power supply 1 includes a semiconductor device 100, various discrete components (a transformer 15, a diode 16, and a capacitor 17) that constitute a switch output circuit 10 together with an output transistor 11 integrated in the semiconductor device 100, and an output feedback circuit 40.

The transformer 15 includes a primary winding Lp (the number of turns Np) and a secondary winding Ls (the number of turns Ns) electromagnetically coupled with opposite polarities while establishing an electrical insulation between the primary circuit system 1p and the secondary circuit system 1s. A first end of the primary winding Lp is connected to an application terminal of the input voltage Vi. A second end of the primary winding Lp is connected to a ground terminal GND1 of the primary circuit system 1p via the output transistor 11 (built in the semiconductor device 100 in the example of this figure). A first end of the secondary winding Ls is connected to an anode of the diode 16. A cathode of the diode 16 and a first end of the capacitor 17 are both connected to an application terminal of the output voltage Vo (corresponding to a high potential end of the load Z). A second end of the secondary winding Ls, a second end of the capacitor 17, and a low potential end of the load Z are all connected to a ground terminal GND2 of the secondary circuit system 1s.

The number of turns Np and Ns may be arbitrarily adjusted so that the desired output voltage Vo can be obtained. For example, the larger the number of turns Np is or the smaller the number of turns Ns is, the lower the output voltage Vo. Conversely, the smaller the number of turns Np is or the larger the number of turns Ns is, the higher the output voltage Vo.

The output feedback circuit 40 generates a feedback signal Sfb according to the output voltage Vo. Although a circuit configuration of the output feedback circuit 40 is arbitrary, a configuration using a shunt regulator and a photo-coupler or a configuration using an auxiliary winding of the transformer 15 is generally used for the output feedback circuit 40.

In the switching power supply 1 of this configuration example, when the output transistor 11 is turned on, since the primary side current Ip flows from the application terminal of the input voltage Vi to the ground terminal GND1 via the primary winding Lp and the output transistor 11, electrical energy is stored in the primary winding Lp. On the other hand, when the output transistor 11 is turned off, since the secondary side voltage is induced in the secondary winding Ls electromagnetically coupled to the primary winding Lp, the secondary side current Is flows from the secondary winding Ls toward the ground terminal GND2 via the diode 16. As a result, the capacitor 17 is charged and the output voltage Vo is supplied to the load Z.

In this way, according to the switching power supply 1 of this configuration example, the output voltage Vo can be generated from the input voltage Vi and supplied to the load Z while establishing the electrical insulation between the primary circuit system 1p and the secondary circuit system 1s. In addition, the fly-back method may be advantageous in reducing costs since it has a small number of components compared with a forward method that requires a smoothing inductor.

Although not shown in the figure, the semiconductor device 100 is equipped with the gate drive circuit 20 described above as a drive means of the output transistor 11.

That is, the gate drive circuit 20 (see FIGS. 2 to 6) including the current capability switching part X can be suitably used not only for the buck converter but also for the fly-back converter.

<Other Modifications>

The various technical features disclosed in the present disclosure may be modified in various ways without departing from the gist of the technical concept, in addition to the embodiments described above. That is, the above-described embodiments should be considered as illustrative in all respects and not restrictive, and the technical scope of the present disclosure should be understood as not being limited to the above-described embodiments but as encompassing all the changes pertaining to the meaning and the scope equivalent to the claims.

INDUSTRIAL AVAILABILITY

The gate drive device described in the present disclosure may be used for all switching power supplies (a DC/DC converter, an AC/DC converter, or a bidirectional inverter) that generate an output voltage from an input voltage.

According to the present disclosure in some embodiments, it is possible to provide a drive circuit that can eliminate a trade-off between noise characteristics and efficiency in a switching power supply.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:
1. A drive circuit comprising:
a current capability switch configured to switch a current capability of driving an output transistor of a switching power supply according to whether a switch current flowing through the output transistor is in a continuous mode or in a discontinuous mode;
a first transistor connected between a first power supply terminal and a control terminal of the output transistor; and
a second transistor connected between a second power supply terminal and the control terminal of the output transistor,
wherein the output transistor is driven by complementarily turning on and turning off the first transistor and the second transistor,
wherein the current capability switch includes:
a third transistor connected in parallel to the first transistor; and
a selector connected to a gate of the third transistor and configured to switch a destination of the gate of the third transistor such that the third transistor is turned off when the switch current is in the continuous mode, and the third transistor is turned on/off in synchronization with the first transistor when the switch current is in the discontinuous mode,
wherein sources and back gates of both the first transistor and the third transistor are connected to the first power supply terminal, wherein a source and a back gate of the second transistor are connected to the second power supply terminal, wherein drains of the first transistor, the second transistor, and the third transistor are connected to the control terminal of the output transistor, and wherein the selector connects the gate of the third transistor to the source of the third transistor when the switch current is in the continuous mode, and connects the gate of the third transistor to the gate of the first transistor when the switch current is in the discontinuous mode.

2. The drive circuit of claim 1, wherein the current capability switch is further configured to lower the current capability when the switch current is in the continuous mode, and raise the current capability when the switch current is in the discontinuous mode.

3. The drive circuit of claim 1, wherein the first transistor is a PMOSFET, the second transistor is an NMOSFET, and the third transistor is a PMOSFET.

4. A switching power supply comprising:
 a switch output circuit configured to use an output transistor to generate an output voltage from an input voltage;
 a drive circuit configured to drive the output transistor; and
 a mode detection circuit configured to detect whether a switch current flowing through the output transistor is in a continuous mode or in a discontinuous mode,
 wherein the drive circuit includes:
  a current capability switch configured to switch a current capability of driving the output transistor according to whether the switch current flowing through the output transistor is in the continuous mode or in the discontinuous mode;
  a first transistor connected between a first power supply terminal and a control terminal of the output transistor; and
  a second transistor connected between a second power supply terminal and the control terminal of the output transistor,
 wherein the output transistor is driven by complementarily turning on and turning off the first transistor and the second transistor,
 wherein the current capability switch includes:

a third transistor connected in parallel to the first transistor; and a selector connected to a gate of the third transistor and configured to switch a destination of the gate of the third transistor such that the third transistor is turned off when the switch current is in the continuous mode, and the third transistor is turned on/off in synchronization with the first transistor when the switch current is in the discontinuous mode, wherein sources and back gates of both the first transistor and the third transistor are connected to the first power supply terminal, wherein a source and a back gate of the second transistor are connected to the second power supply terminal, wherein drains of the first transistor, the second transistor, and the third transistor are connected to the control terminal of the output transistor, and wherein the selector connects the gate of the third transistor to the source of the third transistor when the switch current is in the continuous mode, and connects the gate of the third transistor to the gate of the first transistor when the switch current is in the discontinuous mode.

5. The switching power supply of claim 4, wherein the mode detection circuit is further configured to detect an edge of the switch current at a timing when the output transistor is turned on.

6. The switching power supply of claim 5, wherein the mode detection circuit is further configured to determine that the switch current is in the continuous mode when the edge of the switch current is detected once or a plurality of times in succession, and determine that the switch current is in the discontinuous mode when the edge of the switch current is not detected for a predetermined time.

7. The switching power supply of claim 4, wherein the current capability switch is further configured to lower the current capability when the switch current is in the continuous mode, and raise the current capability when the switch current is in the discontinuous mode.

8. The switching power supply of claim 4, wherein the first transistor is a PMOSFET, the second transistor is an NMOSFET, and the third transistor is a PMOSFET.

* * * * *